United States Patent
Lu et al.

(10) Patent No.: US 12,014,124 B1
(45) Date of Patent: Jun. 18, 2024

(54) METHOD FOR ANALYZING OIL FILM MULTI-FIELD COUPLING CHARACTERISTICS OF SERIES FRICTION PAIRS OF AXIAL PISTON PUMP

(71) Applicant: Wuhan University of Science and Technology, Hubei (CN)

(72) Inventors: Yan Lu, Hubei (CN); Hao Zhang, Hubei (CN); Xinbo Qian, Hubei (CN); Xinyuan Chen, Hubei (CN); Liangcai Zeng, Hubei (CN)

(73) Assignee: Wuhan University of Science and Technology, Hubei (CN)

( * ) Notice: Subject to any disclaimer, the term of this patent is extended or adjusted under 35 U.S.C. 154(b) by 0 days.

(21) Appl. No.: 18/515,984

(22) Filed: Nov. 21, 2023

(30) Foreign Application Priority Data

Dec. 5, 2022  (CN) .......................... 202211547242.3

(51) Int. Cl.
   *G06F 30/17*  (2020.01)
   *F04B 51/00*  (2006.01)

(52) U.S. Cl.
   CPC .............. *G06F 30/17* (2020.01); *F04B 51/00* (2013.01)

(58) Field of Classification Search
   CPC .......... G06F 30/00; G06F 30/17; G06F 30/10; F04B 51/00
   USPC .................................................. 703/10, 6, 1
   See application file for complete search history.

(56) References Cited

U.S. PATENT DOCUMENTS

2020/0376565 A1   12/2020   Li et al.

FOREIGN PATENT DOCUMENTS

| CN | 112380649 A | 2/2021 |
| CN | 113987714 A | 1/2022 |
| CN | 114357661 A | 4/2022 |
| CN | 115013296 A | * 9/2022 |
| CN | 115013296 A | 9/2022 |
| DE | 102007032915 A1 | 1/2009 |

OTHER PUBLICATIONS

Bergada, J.M. et al., "A Complete Analysis of Axial Piston Pump Leakage and Output Flow Ripples", 2012, Applied Mathematical Modeling 36, Elsevier Inc. (Year: 2012).*

(Continued)

*Primary Examiner* — Cedric Johnson
(74) *Attorney, Agent, or Firm* — Piloff Passino & Cosenza LLP; Rachel K. Piloff; Sean A. Passino

(57) ABSTRACT

Provided is a method for analyzing oil film multi-field coupling characteristics of series friction pairs of an axial piston pump in the disclosure. According to the disclosure, based on an oil film independent analysis model of macro structures, motion states and heterogeneities of service conditions of three major friction pairs of the axial piston pair, surface microstructures of the friction pairs is introduced, and a solid-liquid-thermal multi-field coupling analysis method of the friction pairs is proposed for macro information interaction. Finally, a coupling solution of the oil film bearing characteristics of the multi-friction pairs of the system is realized by the multi-scale and multi-degree-of-freedom hydraulic-dynamic global coupling method.

8 Claims, 3 Drawing Sheets

(56) References Cited

OTHER PUBLICATIONS

Gao, Dianrong et al., "Calculation and Analysis of Heat Loss of High-Speed Axial Piston Hydraulic Motor Pump", 2019, The 8th International Conference on Fluid Power and Mechatronics, IEEE. (Year: 2019).*

Jiang, Jihai et al, "The Impact of Slipper Microstructure on Slipper-Swashplate Lubrication Interface in Axial Piston Pump", Dec. 24, 2020, National Natural Science Foundation of China and National Key Research and Development Program of China, Digital Object Identifier. (Year: 2020).*

Lei, Wang et al, "Lubrication Characteristics of External Return Spherical Hinge Pair of Axial Piston Pump or Motor Under Combined Action of Inclination and Offset Distance", 2021, J. Cent. South Univ. 28, Springer Nature. (Year: 2021).*

Ahmat Mutellip et al., "Dynamic Characteristics of the Friction Pair Fluid-film Flow Field for High Parameter Mechanical Seal," Journal of Harbin University of Science and Technology, Oct. 2013, vol. 18, No. 5. (abstract in English).

Wang Bin et al., "Principle of Oil Film Test on Port Pair of Axial Piston Pump and Control Characteristics," Journal of Mechanical Engineering, Nov. 2009, vol. 45, No. 11. (abstract in English).

Xu Bing et al., "Simulative analysis of piston-cylinder pair of axial piston pump based on virtual prototype," Journal of Lanzhou University of Technology, Jun. 2010, vol. 36, No. 3. (abstract in English).

Jie Li et al., "Study on laser cladding process and friction characteristics of friction pairs of copper-based powder metallurgy materials," Tribology International, Jan. 2023, 177, 107953.

First Office Action for China Application No. 202211547242.3, mailed Jun. 27, 2023.

Notice to Grant Patent for China Application No. 202211547242.3, mailed Jul. 21, 2023.

First Search Report for China Application No. 202211547242.3, dated Jun. 27, 2023.

Supplemental Search Report for China Application No. 202211547242.3, dated Jul. 18, 2023.

* cited by examiner

METHOD FOR ANALYZING OIL FILM MULTI-FIELD COUPLING CHARACTERISTICS OF SERIES FRICTION PAIRS OF AXIAL PISTON PUMP

CROSS-REFERENCE TO RELATED APPLICATIONS

This claims priority to Chinese Patent Application No. 202211547242.3, filed on Dec. 5, 2022, the contents of which are hereby incorporated by reference.

TECHNICAL FIELD

The disclosure belongs to a technical field of fluid pressure, and in particular to a method for analyzing oil film multi-field coupling characteristics of series friction pairs of an axial piston pump.

BACKGROUND

At present, the virtual prototype technology is the main technical means for the simulation analysis of the axial piston pump. For example, the simulation accuracy of the virtual prototype technology in the performance analysis of the axial piston pump is verified by comparison, and a multi-mechanical model of mechanical-hydraulic coupling of the axial piston pump is established. However, these studies have not revealed the deep mechanism of axial piston pump failure from the dynamic evolution of tribological performance of friction pairs. At present, some researches relate the virtual prototype technology to the oil film bearing analysis method of friction pairs, but all of them are aimed at a single friction pair, there are three key friction pairs in the axial plunger pair: plunger pair, port pair and slipper pair, the three key friction pairs interact and restrict each other in the operation process of the axial plunger pump, forming a tribological system of the pump. The spatial characteristics of tribology system require that all the elements, namely the three friction pairs, must be studied as a whole when analyzing the performance of the whole pump. Therefore, in order to analyze the oil film bearing characteristics of the axial piston pump, the most important thing is to break through the series technology of multi-friction pairs.

At the same time, the existing oil film bearing analysis of the piston pump friction pairs only considers static loading, but the static loading may not reflect dynamic oscillation characteristics of the axial piston pump under sudden operating conditions. Therefore, it is necessary to combine the hydraulic pressure and the mechanical height to reveal the internal operating mechanism of the pump and analyze the oil film bearing as a loading condition, so as to reflect the transient change of oil film of friction pairs under real operating conditions.

Secondly, the tribology system also has time characteristics, and any wear failure caused by the insufficient bearing capacity of macro oil film comes from the micro-wear cumulative damage, but wear is not considered from a micro perspective in the prior art. Therefore, another key to reveal the oil film bearing mechanism is micro-macro coupling analysis.

SUMMARY

The disclosure aims to provide a method for analyzing oil film multi-field coupling characteristics of series friction pairs of an axial piston pump, so as to solve problems existing in the prior art.

In order to achieve the above purpose, the disclosure provides the method for analyzing the oil film multi-field coupling characteristics of the series friction pairs of the axial piston pump, including following steps:

constructing a three-dimensional geometric model of an axial piston pump; obtaining model parameters by dynamic analysis and calculation; constructing a hydraulic system model, obtaining a dynamic model of the axial piston pump based on the three-dimensional geometric model of the axial piston pump;

carrying out a coupling analysis on the dynamic model of the axial piston pump and the hydraulic system model, calculating operating conditions of friction pairs, oil film acting forces and torques of the friction pairs when the axial piston pump operates, and obtaining synchronous forces and torques of the friction pairs based on analysis of the oil film acting forces and the torques;

setting structure parameters, materials and lubricant properties of the friction pairs, and constructing a tribology model based on settings;

obtaining dynamic evolutions of oil film pressures, oil film distributions and oil film temperatures of the friction pairs based on the tribology model;

calculating an evolution law of an interface structure deformation and a friction coefficient of the friction pairs within a whole rotation of the spindle, defining surface microstructure characteristics, and analyzing an influence of a friction pair microstructure on oil film lubrication characteristics based on the surface microstructure characteristics;

obtaining whole pump leakage under a coupling of the friction pairs based on the dynamic model of the axial piston pump, the hydraulic system model and a tribological model; and optimizing the three-dimensional geometric model of the axial piston pump based on the operating conditions, the oil film acting forces and the torques, and the dynamic evolutions.

Optionally, a process for constructing the dynamic model of the axial piston pump includes: obtaining geometric structure parameters of each part of the axial piston pump, establishing three-dimensional entity diagrams and mechanism assembly diagrams of each part of the axial piston pump, then obtaining the three-dimensional geometric model of the axial piston pump, and carrying out motion, dynamics and position constraints on the three-dimensional geometric model of the axial piston pump to obtain the dynamic model of the axial piston pump.

Optionally, the friction pairs include a slipper pair, a plunger pair and a port pair, and the hydraulic system model is constructed based on a hydraulic oil fluid system shared by the friction pairs, and the hydraulic system model includes a flow model, a motion model and a pressure model.

Optionally, obtaining a motion speed, a displacement and a posture based on the dynamic model of the axial piston pump; obtaining a hydraulic pressure based on the hydraulic system model, and carrying out a data interaction between the movement speed, the displacement and the posture and the hydraulic pressure, and obtaining the operating conditions, the oil film acting forces and the torques of the friction pairs.

Optionally, a process for constructing the tribological model includes: discretizing Reynolds equation and energy equation to solve a pressure field and a temperature field; calculating elastic deformation of a friction pair surface by numerical calculation, and solving interactions between an instantaneous pressure and the elastic deformation; incorporating a viscosity-temperature equation, carrying out a field value distribution on a viscosity in a calculation domain, and carrying out a coupling calculation in real-time on the viscosity in the calculation domain with a fluid, so as to describe an oil compressibility on the friction pair surface and an influence caused by a viscosity change in a fluid lubrication process; where the tribological model uses micromotion postures of the axial piston pump in the operation process, the micromotion postures include an eccentricity of the plunger, an inclination of the slipper and an overturning of the cylinder body; in the calculation process, through an equilibrium iteration of resultant of external forces, after a flow field analysis and calculation at each time step is completed, the posture is adjusted through a force equilibrium equation, and oil film characteristics considering the influence of the operating conditions of the piston pump are calculated, where the oil film characteristics include the dynamic evolutions of the oil film distributions, the oil film pressures and the oil film temperatures.

Optionally, solving a tangential force and a normal force of the oil film at moments corresponding to the oil film characteristics; combined with micromotion abnormal position posture of the friction pairs and material properties of the friction pairs, calculating the interface surface structure deformation and the thickness distribution of the oil film.

Optionally, dividing the thickness distribution of the oil film into regions according to a film thickness ratio, extracting regions with insufficient lubrication from boundary lubrication and mixed lubrication, and carrying out a partition representation on the regions with insufficient lubrication based on a parting model and a microstructure characterization model to obtain a new friction pair interface morphology, and analyzing a change of the oil film characteristics based on a micro-hydrodynamic lubrication effect generated by the new friction pair interface morphology.

Optionally, taking the synchronous forces and torques of the friction pairs obtained by the coupling analysis between the dynamic model of the axial piston pump and the hydraulic system model as dynamic operating conditions, and loading into the tribological geometric model for a series coupling to obtain a leakage of the axial piston pump.

The disclosure has following technical effects:

1. The dynamic model of the axial piston pump, the hydraulic system model, the tribology model and a multi-body joint simulation model are established, and fluid and machinery are highly integrated by coupling dynamics and the hydraulic system to reveal the internal operating mechanism of the pump and solve the dynamic oscillation characteristics of the pump; the tribology model is established by a finite element method and a numerical method, and a data interaction is carried out with the hydraulic model to realize the influence analysis of tribological performances of the three friction pairs in the case of dynamic mutational operating conditions of the pump. The coupling modeling technology of tribology and dynamics is broken through, and the real effectiveness of the tribological performance simulation results under mutational operating conditions is improved.

2. Three key coupled tribological models of fluid, solid and heat fields of friction pairs are proposed. The coupling effects of surface roughness and deformation, rheological characteristics of oil and heat transfer characteristics are considered, multi-scale and multi-degree-of-freedom dynamic behaviors such as eccentricity, overturning and hydraulic hydrodynamic characteristics of oil channels are introduced to study the dynamic evolution of oil film characteristics in three dimensions.

3. Based on the existing virtual prototype technology, the disclosure analyzes the pump as a tribological system. The disclosure focuses on breaking through the spatial characteristics of the three major friction pairs of the pump, and relates the motion characteristics of the three major friction pairs with the exerted forces and the torques through hydraulic dynamics coupling, reflecting the influence of the tribological performances of the three major friction pairs on the overall characteristics of the pump. The multi-body simulation method based on the spatial characteristics of tribology system effectively provides an analysis method of cumulative damage of the friction pairs on performance and life of the pump, and provides an optimal design basis for further improving pump life.

4. Based on the existing virtual prototype technology, the disclosure analyzes the pump as a tribological system. The disclosure focuses on breaking through the time characteristics of the three major friction pairs of the pump, and identifies fluid lubrication, mixed lubrication and boundary lubrication areas by identifying the oil film states of the three major friction pairs, and extracts the corresponding areas with insufficient lubrication and the pressure, temperature and speed, so as to establish a tribological model considering surface micro-roughness and texture morphology. The micro-macro coupling is realized, and the macro-wear damage is predicted by using the micro-wear cumulative damage calculation, thus improving the calculation accuracy of the analysis method.

BRIEF DESCRIPTION OF THE DRAWINGS

The accompanying drawings constituting a part of the disclosure are used to provide a further understanding of this disclosure. The illustrative embodiments of the disclosure and the descriptions are used to explain the disclosure, and do not constitute an improper limitation of the disclosure. In the attached drawings.

DETAILED DESCRIPTION OF THE EMBODIMENTS

It should be noted that the embodiments in the disclosure and the features in the embodiments may be combined with each other without conflict. The present disclosure is described in detail with reference to the attached drawings and embodiments.

It should be noted that the steps shown in the flowchart of the accompanying drawings may be executed in a computer system such as a set of computer-executable instructions, and although the logical order is shown in the flowchart, in some cases, the steps shown or described may be executed in a different order from here.

Embodiment 1

Figure 1:
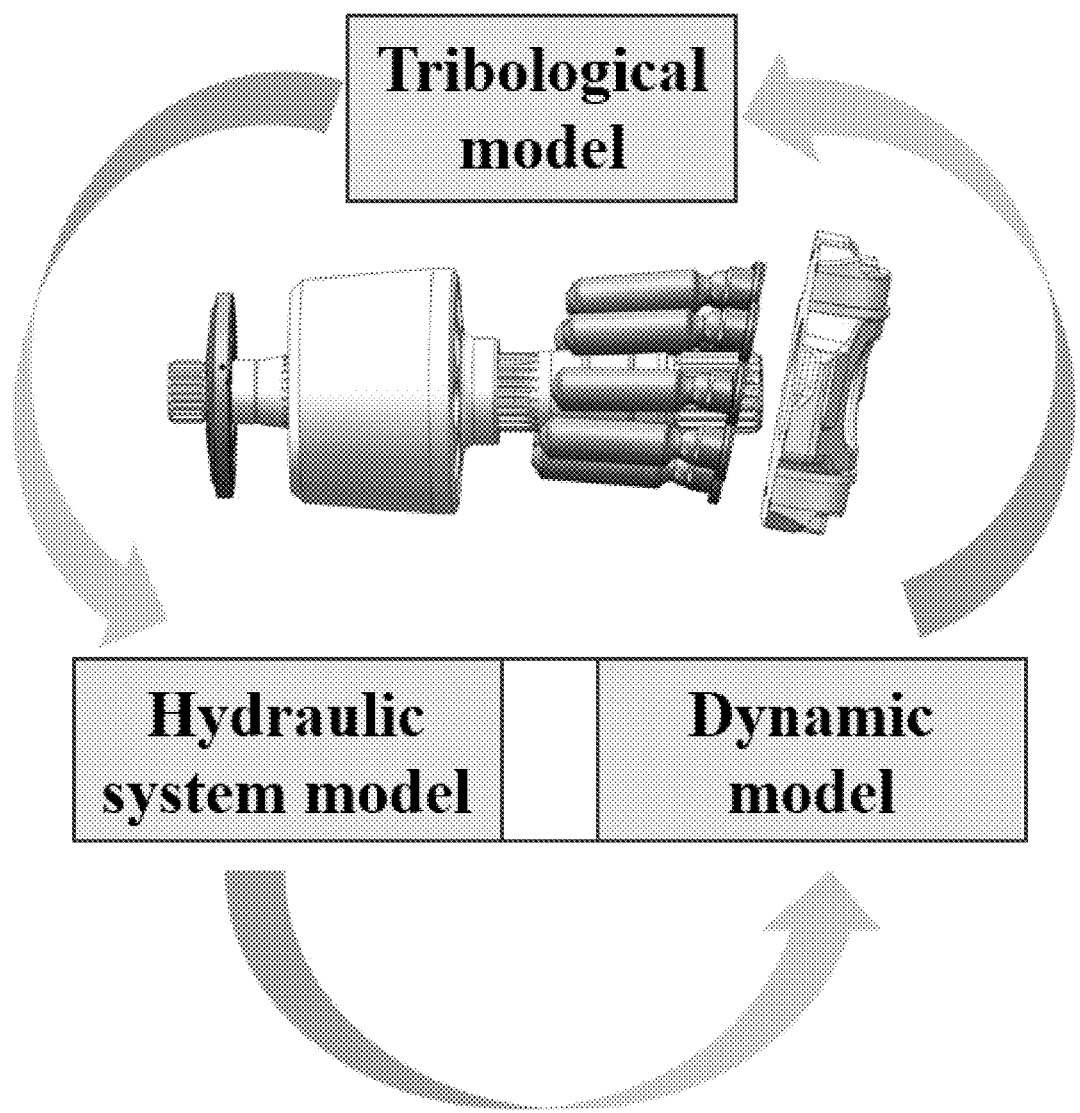
FIG. 1 is a hydraulic/dynamic coupling model of an axial piston pump in an embodiment of the present disclosure.
Figure 2:
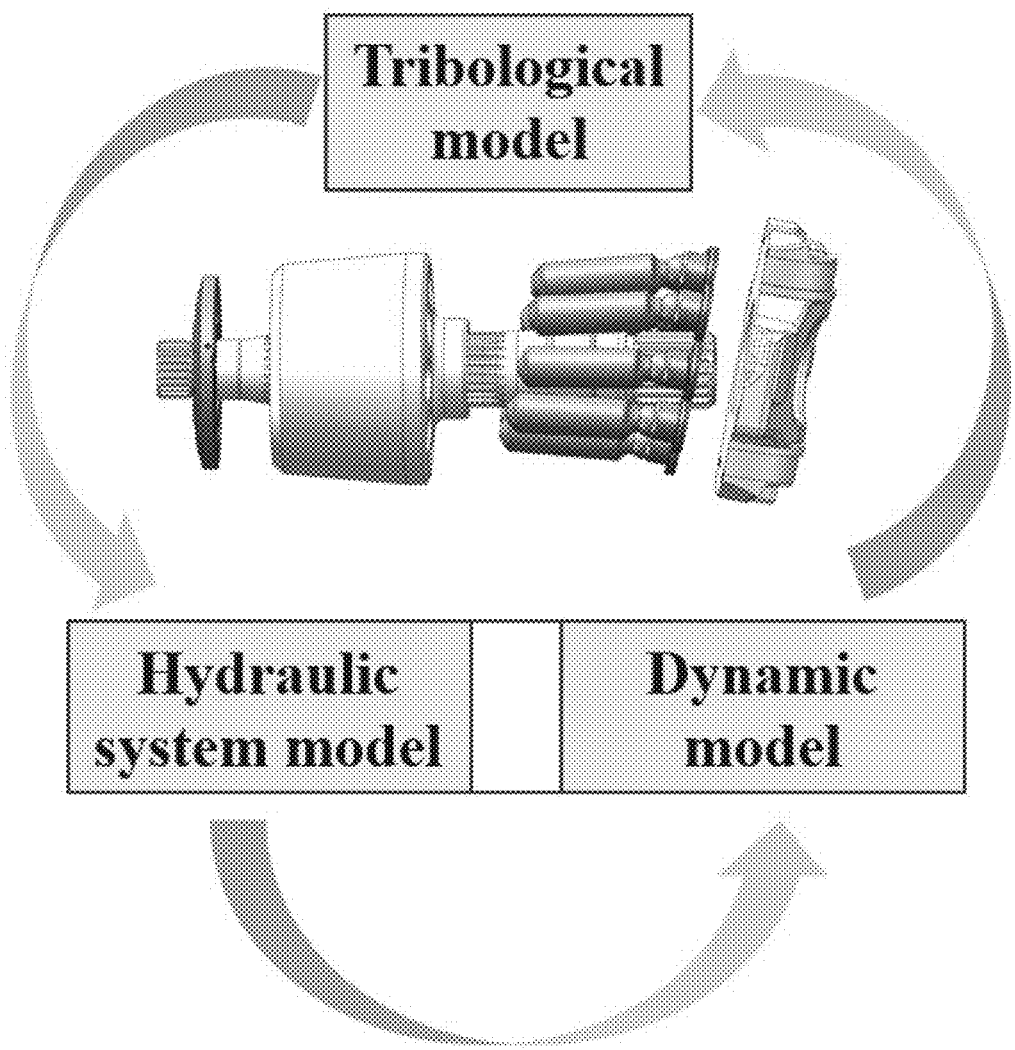
FIG. 2 is a multi-software collaborative simulation method for the axial piston pump in an embodiment of the present disclosure.
Figure 3:
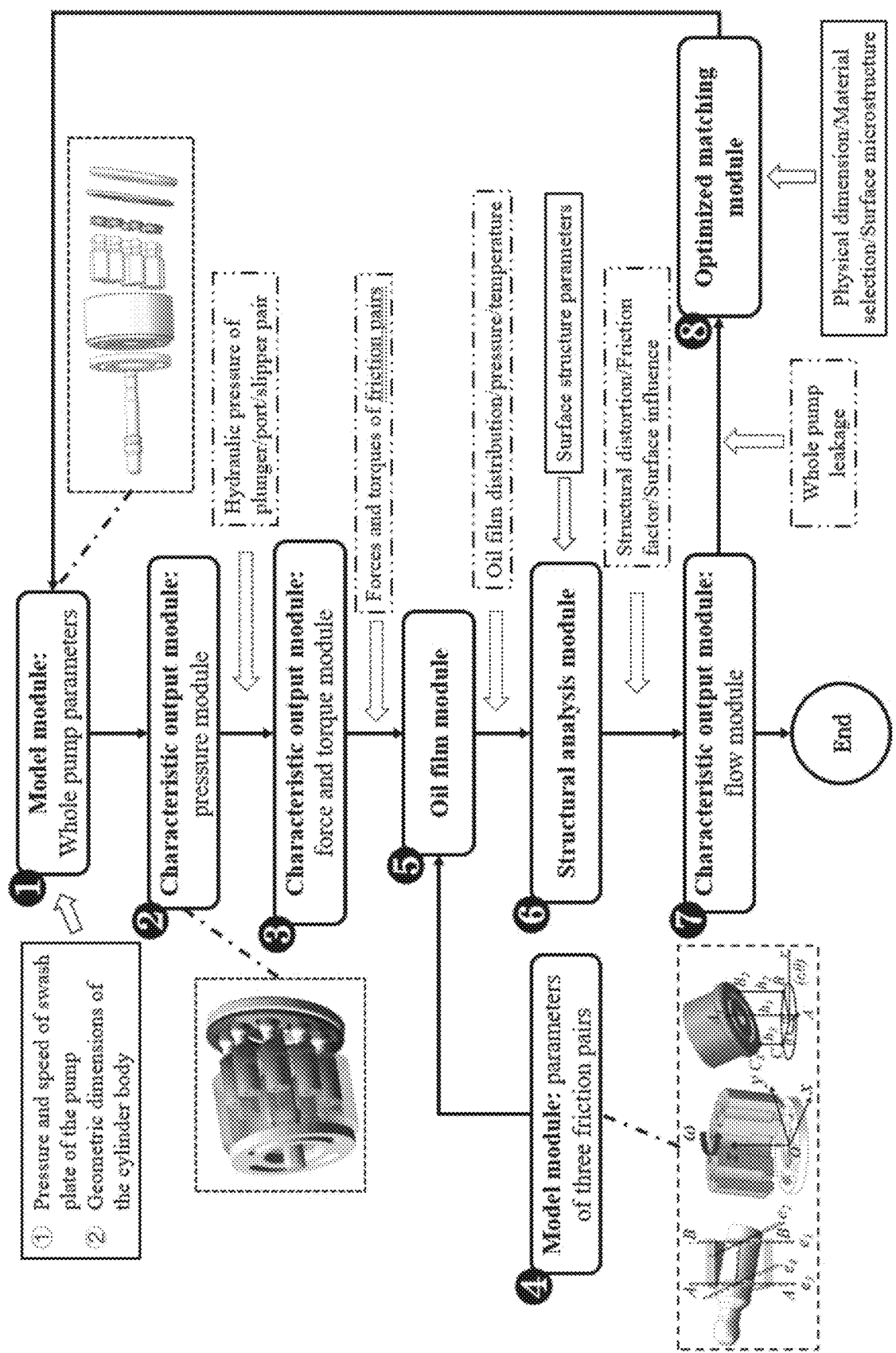
FIG. 3 is an overall flow chart in an embodiment of the present disclosure.

As shown in FIGS. 1-3, the embodiment provides a method for analyzing oil film multi-field coupling characteristics of series friction pairs of an axial piston pump, including:

the technical scheme adopted in the embodiment is an analysis method of oil film bearing characteristics of the axial piston pump based on multi-dimensional dynamic coupling of series friction pairs. Firstly, by clarifying the influencing factors of solid-liquid-thermal multi-field coupling characteristics and multi-scale multi-degree-of-freedom dynamic characteristics of friction pairs under high-pressure operating conditions, the dynamic relationship between friction pairs is ascertained, and a multi-friction pair coupling simulation model is established to obtain the parameter influence law of oil film basic characteristics of the friction pairs under multi-field action, the oil film bearing change characteristics under typical mutational operating conditions are mastered and the oil film bearing mechanism of axial piston pump/motor mutational operating conditions is revealed. Following steps are included:

Step 1: constructing a w % bole pump model of axial piston pump, and setting whole pump parameters, including basic attribute parameters of the whole pump, such as pressure, rotational speed, inclination angle of swash plate and geometric size of cylinder body. The basic parameters are obtained through dynamic analysis and calculation, and the dynamic analysis process is as follows: by obtaining geometric structure parameters of each part of the axial piston pump, establishing three-dimensional part diagrams and assembly diagrams of each part of the axial piston pump in CAD software, and establishing the three-dimensional geometric model of the axial piston pump by importing each part into the dynamic software.

The main key friction pair structures of the axial piston pump include a plunger pair, a port pair and a slipper pair, and the geometric structures include a port plate, a cylinder body, a plunger, a slipper, a swash plate and a spindle. According to the CAD drawings or actual measured values of existing piston pump products, structure parameters, working load, rotating speed and hydraulic oil characteristics of the axial piston pump are obtained.

Step 2: constructing a hydraulic system model. The dynamic model realizes the modeling of the mechanical energy transmission part of the three friction pairs by restricting the motion, dynamics and position of the three-dimensional solid geometric model of the pump, such as a spherical hinge pair of the cylinder body and the port plate, a cylindrical pair of the plunger and the cylinder body, a plane pair of the slipper and the swash plate, etc. The hydraulic system model is modeled by extracting the hydraulic oil fluid system shared by the three friction pairs of the pump, including flow model, motion model and pressure model, and the hydraulic oil fluid system is mainly used to describe the flow and force transmission of the three friction pairs.

Step 3: according to the known product structure and characteristic parameters of the piston pump, through the couple analysis of hydraulic and mechanical dynamics, calculating the oil film acting forces and torques of the three major friction pairs when the axial piston pump operates, and loading the calculated forces of the three major friction pairs to the three major friction pairs, and realizing the series coupling of multiple friction pairs through the analysis of the synchronous forces and torques of the three major friction pairs;

exchanging the parameters such as motion speed, displacement and posture calculated by the dynamic model and the hydraulic pressure calculated by the hydraulic model to realize the hydraulic-mechanical coupling.

Step 4: setting structure parameters, materials and lubricant properties of the plunger pair, the slipper pair and the port pair, and establishing the tribology model according to heterogeneous characteristics of the three friction pairs;

setting structural size parameters, material properties and the lubricant properties of the three friction pairs, and establishing an independent tribological analysis model of the three friction pairs.

Step 5: establishing the solid-thermal-liquid multi-field coupling model of the friction pairs through the joint solution of Reynolds equation, energy equation, elastic deformation equation and viscosity-temperature-viscosity-pressure equation; displaying dynamic evolutions of oil film distributions, oil film pressures and temperatures of the three friction pairs by visual three-dimensional images.

The tribological models of the three friction pairs are considered to consist of four main modules. In the first model, Reynolds equation and energy equation are discretized by a finite volume method to solve the pressure field and the temperature field for describing the fluid flow of lubricating oil in the gap of the friction pairs. The model may accurately predict oil film characteristics including oil film distribution, pressure, temperature and viscosity. Since the average oil film is in the same micron dimension as the elastic deformation of the surface, the elastic deformation of the friction pair surface directly affects the pressure field. At this time, a second model is introduced to calculate the elastic deformation of the friction pair surface by numerical calculation, and the interaction between the instantaneous pressure and the elastic deformation is solved to realize solid-liquid coupling. Friction heat is inevitable in the process of friction, and in a third model, the viscosity-temperature equation is integrated, and a field value distribution on the viscosity in the calculation domain is carried out, and a coupling calculation in real-time on the viscosity in the calculation domain with a fluid is carried out, so as to describe an oil compressibility on the friction pair surface and an influence caused by the viscosity change in a fluid lubrication process, and to realize the thermal-fluid coupling of the friction pairs. Since then, the analysis of the oil film in this step covers an intercoupling effect of thermal-solid-liquid three fields. In the solid-thermal-liquid multi-field coupling model, the micromotion postures of the three friction pairs during the pump operation process are considered, and the micromotion postures of the three friction pairs include an eccentricity of a plunger, an inclination of a slipper and an overturning of a cylinder body, etc.; in the calculation process, through an equilibrium iteration of resultant of all the external forces, after the flow field analysis and calculation at each time step is completed, the posture is adjusted through a force equilibrium equation, and finally the oil film characteristics considering the influence of the operating conditions of the piston pump are calculated. The elastic deformation, thermal deformation and total deformation of the surface of the port pair are calculated by realizing the coupling of thermal-solid-liquid three fields.

Step 6: calculating an evolution law of an interface structure deformation and a friction coefficient of the friction pairs within a whole rotation of a spindle, defining surface microstructure characteristics, and analyzing an influence of a friction pair microstructure on oil film lubrication characteristics;

aiming at solving the tangential force and the normal force of the oil film at the moment corresponding to the oil film characteristics obtained in the step 5, the evolution law of the friction coefficient during the whole rotation of the spindle is calculated. At the same time, the lubrication regions are identified according to the oil film thickness distribution, and the regions with insufficient lubrication in boundary lubrication and mixed lubrication are extracted and represented by a parting model and a microstructure characterization model, so as to realize multi-field coupling analysis based on micro-morphology, and to reveal the influence of micro-wear cumulative damage on macro-wear damage.

Step 7: calculating the leakage of the whole pump under the couple action of the three major friction pairs through the cumulative damage analysis of the tribological performance of the friction pairs:

coupling the dynamic model, the hydraulic system model and the tribological model, that is, using the synchronous forces and torques of the three friction pairs calculated by hydraulic-mechanical coupling as dynamic operating conditions, loading into the tribological model of the three friction pairs for series coupling, and realizing the performance calculation of the whole pump based on the cumulative damage coupling of the tribological performance of the three friction pairs.

Step 8: improving the drag reduction performance of the oil film support of the three friction pairs through the design of structural size, material selection and surface microstructure, and improving the service performance and the service life of the axial piston pump.

By analyzing the service performance of axial piston pump, the factors affecting oil film friction and lubrication characteristics of the friction pairs of the axial piston pump may be obtained. Through the design of the structural size, material selection and surface microstructure of the three friction pairs, the drag reduction performance of the oil film support of the friction pairs is improved, and the service performance and the service life of the axial piston pump are improved.

The above is only the preferred embodiment of the disclosure, but the protection scope of the disclosure is not limited to this. Any change or replacement that may be easily thought of by a person familiar with this technical field within the technical scope disclosed in the disclosure should be covered by the disclosure. Therefore, the protection scope of the disclosure should be based on the protection scope of the claims.

What is claimed is:

1. A method for analyzing oil film multi-field coupling characteristics of series friction pairs of an axial piston pump, comprising following steps:

constructing a three-dimensional geometric model of an axial piston pump;
obtaining model parameters by dynamic analysis and calculation;
constructing a hydraulic system model;
obtaining a dynamic model of the axial piston pump based on the three-dimensional geometric model of the axial piston pump;
the series friction pairs of the axial piston pump comprises a plunger pair, a port pair and a slipper pair, and geometric structures comprises a port plate, a cylinder body, a plunger, a slipper, a swash plate and a spindle involved;
obtaining values for existing piston pump products, structure parameters, a working load, a rotating speed and hydraulic oil characteristics of the axial piston pump based on computer-aided design (CAD) drawings or actual measurements;
carrying out a coupling analysis on the dynamic model of the axial piston pump and the hydraulic system model, calculating operating conditions of friction pairs, oil film acting forces and torques of the friction pairs when the axial piston pump operates, and obtaining synchronous forces and torques of the friction pairs based on analysis of the oil film acting forces and the torques;
setting structure parameters, materials and lubricant properties of the friction pairs, and constructing a tribological geometric analysis model based on settings;
obtaining dynamic evolutions of oil film pressures, oil film distributions and oil film temperatures of the friction pairs based on the tribological geometric analysis model;
calculating an evolution law of an interface structure deformation and a friction coefficient of the friction pairs within a whole rotation of the spindle, defining surface microstructure characteristics, and analyzing an influence of a friction pair microstructure on oil film lubrication characteristics based on the surface microstructure characteristics;
obtaining whole pump leakage under a coupling of the friction pairs based on the dynamic model of the axial piston pump, the hydraulic system model and the tribological analysis model;
optimizing the three-dimensional geometric model of the axial piston pump based on the operating conditions, the oil film acting forces and the torques, and the dynamic evolutions;
establishing a solid-thermal-liquid multi-field coupling model of the friction pairs through a joint solution of Reynolds equation, energy equation, elastic deformation equation and viscosity-temperature-viscosity-pressure equation; and displaying the dynamic evolutions of the oil film distributions, the oil film pressures and temperatures of the plunger pair, the port pair and the slipper pair by visual three-dimensional images.

2. The method for analyzing the oil film multi-field coupling characteristics of series friction pairs of the axial piston pump according to claim 1, wherein:

a process for constructing the dynamic model of the axial piston pump comprises: obtaining geometric structure parameters of each part of the axial piston pump, establishing three-dimensional entity diagrams and mechanism assembly diagrams of each part of the axial piston pump, then obtaining the three-dimensional geometric model of the axial piston pump, and carrying out motion, dynamics and position constraints on the three-dimensional geometric model of the axial piston pump to obtain the dynamic model of the axial piston pump.

3. The method for analyzing the oil film multi-field coupling characteristics of series friction pairs of the axial piston pump according to claim 1, wherein;

the hydraulic system model is constructed based on a hydraulic oil fluid system shared by the friction pairs, and the hydraulic system model comprises a flow model, a motion model and a pressure model.

4. The method for analyzing the oil film multi-field coupling characteristics of series friction pairs of the axial piston pump according to claim 1, wherein:
obtaining a motion speed, a displacement and a posture based on the dynamic model of the axial piston pump;
obtaining a hydraulic pressure based on the hydraulic system model, and carrying out a data interaction between the movement speed, the displacement and the posture and the hydraulic pressure, and obtaining the operating conditions, the oil film acting forces and the torques of the friction pairs.

5. The method for analyzing the oil film multi-field coupling characteristics of series friction pairs of the axial piston pump according to claim 1, wherein:
a process for constructing the tribological geometric analysis model comprises:
discretizing Reynolds equation and energy equation to solve a pressure field and a temperature field;
calculating an elastic deformation of a friction pair surface by numerical calculation, and solving interactions between an instantaneous pressure and the elastic deformation;
incorporating a viscosity-temperature equation, carrying out a field value distribution on a viscosity in a calculation domain, and carrying out a coupling calculation in real-time with a fluid, so as to describe an oil compressibility on the friction pair surface and an influence caused by a viscosity change in a fluid lubrication process;
wherein the model uses micromotion postures of the pump in an operation process, the micromotion postures comprise an eccentricity of the plunger, an inclination of the slipper and an overturning of the cylinder body;
in a calculation process, through an equilibrium iteration of resultant of external forces, after a flow field analysis and calculation at each time step is completed, the posture is adjusted through a force equilibrium equation, and oil film characteristics considering an influence of operating conditions of a piston pump are calculated, wherein the oil film characteristics comprise the dynamic evolutions of the oil film distributions, the oil film pressures and the oil film temperatures.

6. The method for analyzing the oil film multi-field coupling characteristics of series friction pairs of the axial piston pump according to claim 5, wherein:
solving a tangential force and a normal force of the oil film at moments corresponding to the oil film characteristics; combined with micromotion abnormal position posture of the friction pairs and material properties of the friction pairs, calculating an interface surface structure deformation and a thickness distribution of the oil film.

7. The method for analyzing the oil film multi-field coupling characteristics of series friction pairs of the axial piston pump according to claim 6, wherein:
dividing the thickness distribution of the oil film into regions according to a film thickness ratio, extracting regions with insufficient lubrication from boundary lubrication and mixed lubrication, and carrying out a partition representation on the regions with insufficient lubrication based on a parting model and a microstructure characterization model to obtain a new friction pair interface morphology, and analyzing a change of the oil film characteristics based on a micro-hydrodynamic lubrication effect generated by the new friction pair interface morphology.

8. The method for analyzing the oil film multi-field coupling characteristics of series friction pairs of the axial piston pump according to claim 1, wherein:
taking the synchronous forces and torques of the friction pairs obtained by the coupling analysis between the dynamic model of the axial piston pump and the hydraulic system model as dynamic operating conditions, and loading into the tribological geometric model for a series coupling to obtain a leakage of the axial piston pump.

* * * * *